(12) United States Patent
Kanbe

(10) Patent No.: US 8,289,425 B2
(45) Date of Patent: Oct. 16, 2012

(54) SOLID-STATE IMAGE PICKUP DEVICE WITH AN IMPROVED OUTPUT AMPLIFIER CIRCUITRY

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 379 days.

(21) Appl. No.: 12/585,287

(22) Filed: Sep. 10, 2009

(65) Prior Publication Data

US 2010/0079652 A1    Apr. 1, 2010

(30) Foreign Application Priority Data

Sep. 29, 2008  (JP) ................................. 2008-251667
Aug. 31, 2009  (JP) ................................. 2009-200286

(51) Int. Cl.
*H04N 5/335* (2011.01)
*H04N 3/14* (2006.01)

(52) U.S. Cl. ........ 348/300; 348/294; 348/299; 348/311; 257/291; 257/292; 250/208.1

(58) Field of Classification Search .................. 348/311, 348/300, 299
See application file for complete search history.

(56) References Cited

U.S. PATENT DOCUMENTS

| | | | | |
|---|---|---|---|---|
| 4,623,927 A | * | 11/1986 | Hoshino | 348/298 |
| 5,060,070 A | * | 10/1991 | Nishida et al. | 348/250 |
| 5,239,192 A | * | 8/1993 | Hirota | 257/239 |
| 6,100,552 A | * | 8/2000 | Ingram | 257/239 |
| 6,518,607 B2 | * | 2/2003 | Hynecek | 257/239 |
| 6,917,041 B2 | * | 7/2005 | Doty et al. | 250/370.09 |
| 2003/0035057 A1 | * | 2/2003 | Hakamata et al. | 348/311 |
| 2007/0258004 A1 | * | 11/2007 | Honda et al. | 348/311 |

FOREIGN PATENT DOCUMENTS

| | | |
|---|---|---|
| JP | 07-079385 | 3/1995 |
| JP | 08-298626 | 11/1996 |
| JP | 2003-158679 | 5/2003 |

OTHER PUBLICATIONS

Shigeyuki et al, Charge-Coupled Device Technology, 1996, Gordon & Breach Publishers, vol. 30, pp. 153-154.*
Albert J.P. Theuwissen, Solid-State Imaging With Charge-Coupled Devices, 1995, Kluwer Academic Publishers, pp. 234-235.*
Rainer Sandau, Digital Airborne Camera—Introduction and Technology, Translation of a book published in 2005, 2010, Springer, pp. 196-198.*

* cited by examiner

*Primary Examiner* — Jason Chan
*Assistant Examiner* — Cynthia Segura
(74) *Attorney, Agent, or Firm* — Rader Fishman & Grauer, PLLC

(57) ABSTRACT

A solid-state image pickup device includes a plurality of light sensing sections; a plurality of vertical transfer registers configured to transfer signal charge of the plurality of light sensing sections in the vertical direction; a horizontal transfer register configured to transfer the signal charge in the horizontal direction; a floating gate amplifier that is placed at an output side of the horizontal transfer register; a floating diffusion amplifier that is placed in a horizontal transfer register which is provided at a stage subsequent to the floating gate amplifier; and an overflow drain mechanism that is placed in the horizontal transfer register between the floating gate amplifier and the floating diffusion amplifier.

15 Claims, 5 Drawing Sheets

SOLID-STATE IMAGE PICKUP DEVICE WITH AN IMPROVED OUTPUT AMPLIFIER CIRCUITRY

BACKGROUND OF THE INVENTION

1. Field of the Invention

The present invention relates to a solid-state image pickup device of a charge coupled device (CCD) type and a method for driving the solid-state image pickup device, and an electronic apparatus, such as a camera, including the solid-state image pickup device.

2. Description of the Related Art

As solid-state image pickup devices, solid-state image pickup devices using charge coupled elements (CCDs) are in common use. In such a solid-state image pickup device of a CCD type (hereinafter, referred to as a "CCD solid-state image pickup device"), a plurality of light sensing units are arranged in a two-dimensional matrix form. Each of the light sensing units is configured using a photoelectric conversion element that generates signal charge in accordance with the amount of received light and that stores the signal charge, i.e., a photodiode. Light signals from an object enter the photodiodes of the light sensing units. Signal charge is generated in accordance with the light signals, and stored. Each of vertical transfer registers having a CCD structure is provided for a corresponding one of columns of the light sensing units. The signal charge is transferred by the vertical transfer registers in the vertical direction, and transferred by a horizontal transfer register having a CCD structure in the horizontal direction. Then, the signal charge that has been transferred in the horizontal direction is output as image information concerning the object from an output section having a charge-to-voltage conversion unit. Typically, the output section is configured using a so-called floating diffusion amplifier (an FD amplifier) including a floating diffusion (FD) unit, which is connected to a final stage of the horizontal transfer resister, and a source follower amplifier. Further, a so-called floating gate amplifier (an FG amplifier) is in common use as the output section.

The CCD solid-state image pickup devices are broadly used, for example, in digital still cameras or digital video cameras. Furthermore, the CCD solid-state image pickup devices are used as solid-state image pickup devices that are mounted in mobile apparatuses, such as mobile phones with cameras or personal digital assistants (PADs).

In recent years, in the CCD solid-state image pickup devices, as the number of pixels has been increased and the resolution has been increased, the conversion gain of FD amplifiers has been increased. In other words, since the size of pixels has been reduced and the amount of charge that can be handled has been reduced, FD amplifiers having high conversion gains have been used.

On the other hand, a CCD solid-state image pickup device in which the size of pixels is large, the amount of charge that light sensing units, vertical transfer registers, or a horizontal transfer register can handle can be easily set to be large. However, because of constraints to the allowable voltage amplitude of FD amplifiers, an FD amplifier having a reduced conversion gain is used. Typically, FD amplifiers have high conversion gains. However, in the CCD solid-state image pickup device in which the size of pixels is large, because of the above-mentioned constraints, an FD amplifier is mounted, which has a conversion gain that is increased within a range of the allowable voltage of the amplifier.

In order to improve the S/N ratio of a source follower amplifier that is included in the FD amplifier, a configuration is used, in which the mutual conductance (gm) of a drive MOS transistor that is placed at a first stage is increased, and in which the capacitance of a gate unit is reduced. However, in the CCD solid-state image pickup device in which the size of pixels is large and in which the amount of charge that can be handled is large, the capacitance of a floating diffusion unit or the gate unit is set to be larger, so that the conversion gain of the FD amplifier is reduced. As a result, the S/N ratio is sacrificed in a case of low illuminance.

Hitherto, as CCD solid-state image pickup devices that can support both a small signal and a large signal, some CCD solid-state image pickup devices having a configuration in which a capacitor is added to a floating diffusion unit have been proposed. Regarding the operation principal, either a small capacitor or a large capacitor can be set in the floating diffusion unit. The floating diffusion unit has a high conversion gain when the small capacitor is set, and has a low conversion gain when the large capacitor is set. With the high conversion gain and the low conversion gain, a case in which a small signal is input and a case in which a large signal is input are supported, respectively. In this case, the conversion gain is switched in accordance with determination using a signal of the previous frame or the like. Alternatively, the conversion gain is manually switched.

In Japanese Unexamined Patent Application Publication No. 7-79385, a CCD solid-state image pickup device is proposed, in which a charge-to-voltage conversion efficiency can be changed so that the best S/N ratio can be obtained in accordance with the amount of incident light. As a distinctive configuration, a configuration is used, in which a plurality of horizontal transfer registers are provided, in which each of charge detection circuits having charge-to-voltage conversion efficiencies that are different from each other is connected to a corresponding one of the horizontal transfer registers, and in which the horizontal transfer registers are selectively used in accordance with the amount of received light.

Furthermore, in Japanese Unexamined Patent Application Publication No. 8-298626, a CCD solid-state image pickup device is proposed, which has both a typical-sensitivity mode and a high-sensitivity mode so that the CCD solid-state image pickup device can be used both during the daytime and during the nighttime. As a distinctive configuration, a configuration is used, in which a horizontal transfer register has divided output terminals of two transfer channels, in which each of the output terminals is connected to a corresponding one of a charge detector having a typical sensitivity and a charge detector having a high sensitivity (FD amplifiers), and in which a signal in the typical-sensitivity mode and a signal in the high-sensitivity mode that are output from the respective charge detectors are selectively output via a sensitivity switching circuit.

In Japanese Unexamined Patent Application Publication No. 2003-158679, a CCD solid-state image pickup device that is utilized in an endoscope in which either a typical image pickup mode or a fluorescence image pickup mode can be set is proposed. As a distinctive configuration, the following configuration is used. A charge multiplication stage having a plurality of stages is connected to an output side of a horizontal transfer register. A floating gate electrode is formed in the middle of the charge multiplication stage. Signal charge that has been output from the charge multiplication stage is supplied to a first floating diffusion amplifier (FDA) having a low conversion coefficient. An intermediate output signal of the charge multiplication stage is supplied from the floating gate electrode to a second FDA having a high conversion coefficient. Then, an output signal of the first or second FDA is selected via a selector, thereby selecting an image signal in the fluorescence image pickup mode (a first FDA output) or an image signal in the typical image pickup mode (a second FDA output).

SUMMARY OF THE INVENTION

As described above, typically, an output section of a CCD solid-state image pickup device has a configuration in which an FD amplifier having a high conversion gain is used. Thermal noise and 1/f noise are reduced, and the S/N characteristics are ensured in a case of low illuminance. However, with this configuration, when realization of a CCD solid-state image pickup device in which the size of pixels is large and in which the amount of charge that light sensing units can handle is large is desired, a dynamic range of an FD amplifier that performs charge-to-voltage conversion tops out because of a large amount of signal charge. Accordingly, the CCD solid-state image pickup device is configured using an FD amplifier having a comparatively low conversion gain as a result. Thus, there is a problem that it is difficult to ensure the S/N characteristics in a case of low illuminance.

In the view of the above-described circumstances, it is desirable to provide a solid-state image pickup device of the CCD type that can support a large amount of signal charge and that can ensure the S/N characteristics in a case of a small amount of signal charge and a method for driving the solid-state image pickup device, and an electronic apparatus including the solid-state image pickup device.

A solid-state image pickup device according to an embodiment of the present invention includes a plurality of light sensing sections; a plurality of vertical transfer registers configured to transfer signal charge of the plurality of light sensing sections in the vertical direction; a horizontal transfer register configured to transfer the signal charge in the horizontal direction; and a floating gate amplifier that is placed at an output side of the horizontal transfer register. Furthermore, the solid-state image pickup device according to the embodiment further includes a floating diffusion amplifier that is placed in a horizontal transfer register which is provided at a stage subsequent to the floating gate amplifier, and an overflow drain mechanism that is placed in the horizontal transfer register between the floating gate amplifier and the floating diffusion amplifier.

In the solid-state image pickup device according to the embodiment of the present invention, a large amount of signal charge is read by the floating gate amplifier, and a small amount of signal charge is read by the floating diffusion amplifier. From signal charge that has passed through the floating gate amplifier, excess charge is drained with the overflow drain mechanism, and remaining charge is transferred as a small amount of charge to the floating diffusion amplifier. When the floating gate amplifier is configured so that it has a low conversion gain, high S/N characteristics and a high dynamic range can be maintained in a case of a large signal. When the floating diffusion amplifier is configured so that it has a high conversion gain, high S/N characteristics can be ensured in a case of a small signal. The solid-state image pickup device according to the embodiment can support input signals corresponding to a wide range of light amount.

In a method for driving a solid-state image pickup device according to an embodiment of the present invention, from signal charge that has been transferred inside a horizontal transfer register, a large amount of signal charge is read by a floating gate amplifier. Furthermore, from the signal charge that has been transferred inside the horizontal transfer register, a small amount of signal charge is read by a floating diffusion amplifier which is placed at a stage subsequent to the floating gate amplifier and which has a conversion gain higher than that of the floating gate amplifier.

In the method for driving a solid-state image pickup device according to the embodiment of the present invention, since a large amount of signal charge is read by the floating gate amplifier having a low conversion gain, high S/N characteristics and a high dynamic range can be maintained in a case of a large signal. Since a small amount of signal charge is read by the floating diffusion amplifier having a high conversion gain, high S/N characteristics can be ensured in a case of a small signal. With the driving method according to the embodiment, input signals corresponding to a wide range of light amount can be supported.

An electronic apparatus according to an embodiment of the present invention includes an optical system, a solid-state image pickup device, and a signal processing circuit configured to process an output signal of the solid-state image pickup device. The solid-state image pickup device includes a plurality of light sensing sections; a plurality of vertical transfer registers configured to transfer signal charge of the plurality of light sensing sections in the vertical direction; and a horizontal transfer register configured to transfer the signal charge in the horizontal direction; and a floating gate amplifier that is placed at an output side of the horizontal transfer register. The solid-state image pickup device further includes a floating diffusion amplifier that is placed in a horizontal transfer register which is provided at a stage subsequent to the floating gate amplifier, and an overflow drain mechanism that is placed in the horizontal transfer register between the floating gate amplifier and the floating diffusion amplifier.

With the solid-state image pickup device and the driving method therefor according to the embodiments of the present invention, a large amount of signal charge can be supported, and the S/N characteristics can be ensured in a case of a small amount of signal charge.

With the electronic apparatus according to the embodiment of the present invention, since the electronic apparatus includes the solid-state image pickup device, a large amount of signal charge can be supported, and the S/N characteristics can be ensured in a case of a small amount of signal charge. The high-quality electronic apparatus can be provided.

DESCRIPTION OF THE PREFERRED EMBODIMENTS

Hereinafter, embodiments of the present invention will be described with reference to the accompanying drawings.

First Embodiment

Example of Configuration of Solid-State Image Pickup Device

Figure 1:
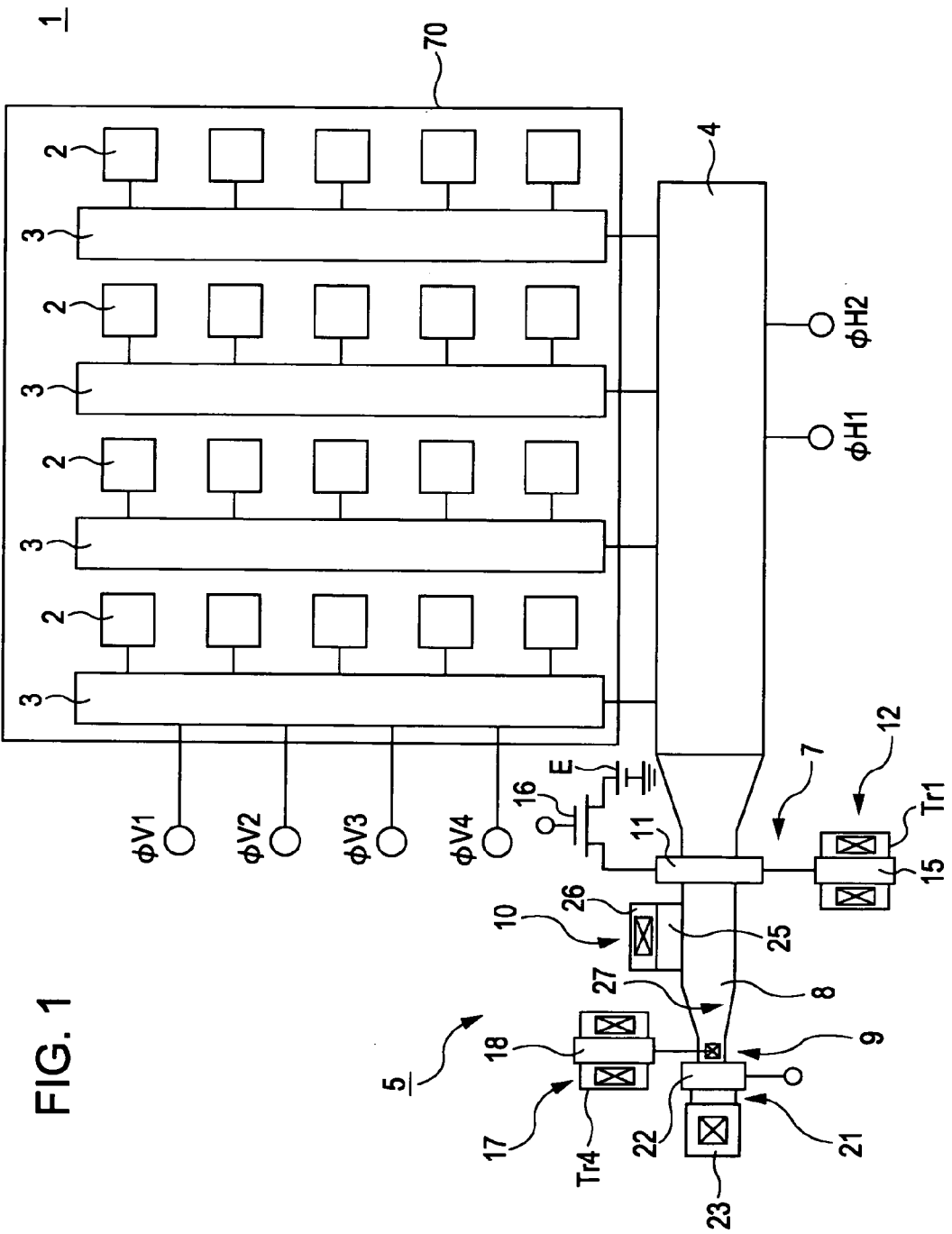
FIG. 1 is a schematic diagram of a configuration of a solid-state image pickup device according to a first embodiment of the present invention.

FIG. 1 shows a solid-state image pickup device according to an embodiment of the present invention, i.e., a CCD solid-state image pickup device according to a first embodiment. A solid-state image pickup device 1 according to the first embodiment includes a plurality of light sensing units 2, vertical transfer registers 3, which have a CCD structure and each of which is provided for a corresponding one of columns of the respective light sensing units 2, a horizontal transfer register 4 having a CCD structure, and an output section 5. A pixel section, i.e., an image pickup region 70, includes the light sensing units 2 and the vertical transfer registers 3.

Each of the light sensing units 2 is formed using a photodiode serving as a photoelectric conversion element. One pixel is configured using the light sensing unit 2 and a corresponding portion of the vertical transfer registers 3. The vertical transfer registers 3 have a configuration (not illustrated) in which an embedded transfer channel is formed on a front side of a semiconductor substrate, and in which a plurality of vertical transfer electrodes are arranged above the embedded transfer channel in a charge transfer direction so that a gate insulator film is provided between the vertical transfer electrodes and the embedded transfer channel. The embedded transfer channel is formed, for example, using n-type semiconductor regions. In an example shown in FIG. 1, drive pulses $\phi V1$ to $\phi V4$ having four phases are applied to the vertical transfer registers 3, and the vertical transfer registers 3 transfer signal charge in the vertical direction. The horizontal transfer register 4 has a configuration, as described below, in which an embedded transfer channel is formed on the front side of the semiconductor substrate as in the above-mentioned case, and in which a plurality of horizontal transfer electrodes are arranged above the embedded transfer channel in a charge transfer direction so that a gate insulator film is provided between the horizontal transfer electrodes and the embedded transfer channel.

In the first embodiment, more particularly, the output section 5 includes a floating gate amplifier 7, a floating diffusion amplifier 9, and an overflow drain mechanism 10 between the floating gate amplifier 7 and the floating diffusion amplifier 9. In other words, the floating gate amplifier 7 is placed at an output side of the horizontal transfer register 4. Furthermore, the floating diffusion amplifier 9 is placed at a final stage of a horizontal transfer register 8 having a CCD structure that is a stage subsequent to the floating gate amplifier 7.

The floating gate amplifier 7 includes a floating gate unit 11, in which a floating gate electrode is formed above an embedded transfer channel so that a gate insulator film is provided between the floating gate electrode and the embedded transfer channel, and a source follower amplifier 12, in which MOS transistors are used. A gate electrode of the floating gate unit 11 is connected to a gate electrode 15 of a drive transistor Tr1 of the source follower amplifier 12. Furthermore, the gate electrode of the floating gate unit 11 is connected to a source of a reset transistor 16. The reset transistor 16 is formed using MOS transistors. A desired positive voltage E is applied to a drain of the reset transistor 16. After a gate of the reset transistor 16 is turned on, the gate of the reset transistor 16 is turned off, thereby setting the potential of the gate electrode of the floating gate unit 11 to be the positive voltage E. In this state, when signal charge is transferred under the gate electrode of the floating gate unit 11, the potential of the gate electrode is changed by the signal charge. Then, by turning on the gate of the reset transistor 16, the potential of the gate electrode of the floating gate unit 11 is reset to be the positive voltage E.

The floating diffusion amplifier 9 includes a floating diffusion unit FD, which is connected to the final stage of the horizontal transfer register 8, and a source follower amplifier 17, in which MOS transistors are used. The floating diffusion unit FD is connected to a gate electrode 18 of a drive transistor Tr4 of the source follower amplifier 17. The floating diffusion unit FD is connected to a reset transistor 21. A reset pulse is applied to a reset gate electrode 22 so that the reset transistor 21 is turned on, thereby resetting the reset gate electrode 22 to be the potential of a reset drain 23. The reset transistor 21 is formed using MOS transistors.

The overflow drain mechanism 10 includes an overflow control gate region 25, which is formed at a side portion of the horizontal transfer register 8 that is placed at the stage subsequent to the floating gate amplifier 7, and an overflow drain region 26.

The horizontal transfer register 8 that is provided at a stage subsequent to the overflow drain mechanism 10 includes a last transfer unit 27 whose transfer channel width d1 becomes smaller in a direction toward to the floating diffusion unit FD that is included in the floating diffusion amplifier 9.

In the overflow drain mechanism 10, the potential of the overflow control gate region 25 is set so that excess charge beyond a dynamic range of the floating diffusion amplifier 9 will be drained. In other words, the potential of the overflow control gate region 25 is set so that excess charge in excess of the amount of charge which the floating diffusion amplifier 9 can handle or the amount of charge which the last transfer unit 27 can handle will be drained.

The floating diffusion amplifier 9 is configured using an amplifier having a high conversion gain. The floating gate amplifier 7 is configured using an amplifier having a conversion gain lower than that of the floating diffusion amplifier 9, e.g., a medium conversion gain or a low conversion gain (hereinafter, referred to as a "medium/low conversion gain").

The horizontal transfer register 4, which is connected to end portions of the vertical transfer registers 3, and the horizontal transfer register 8, which is placed at a subsequent stage, are driven so that they transfer signal charge in the horizontal direction using drive pulses $\phi H1$ and $\phi H2$ having two phases in the example shown in FIG. 1.

Figure 2:
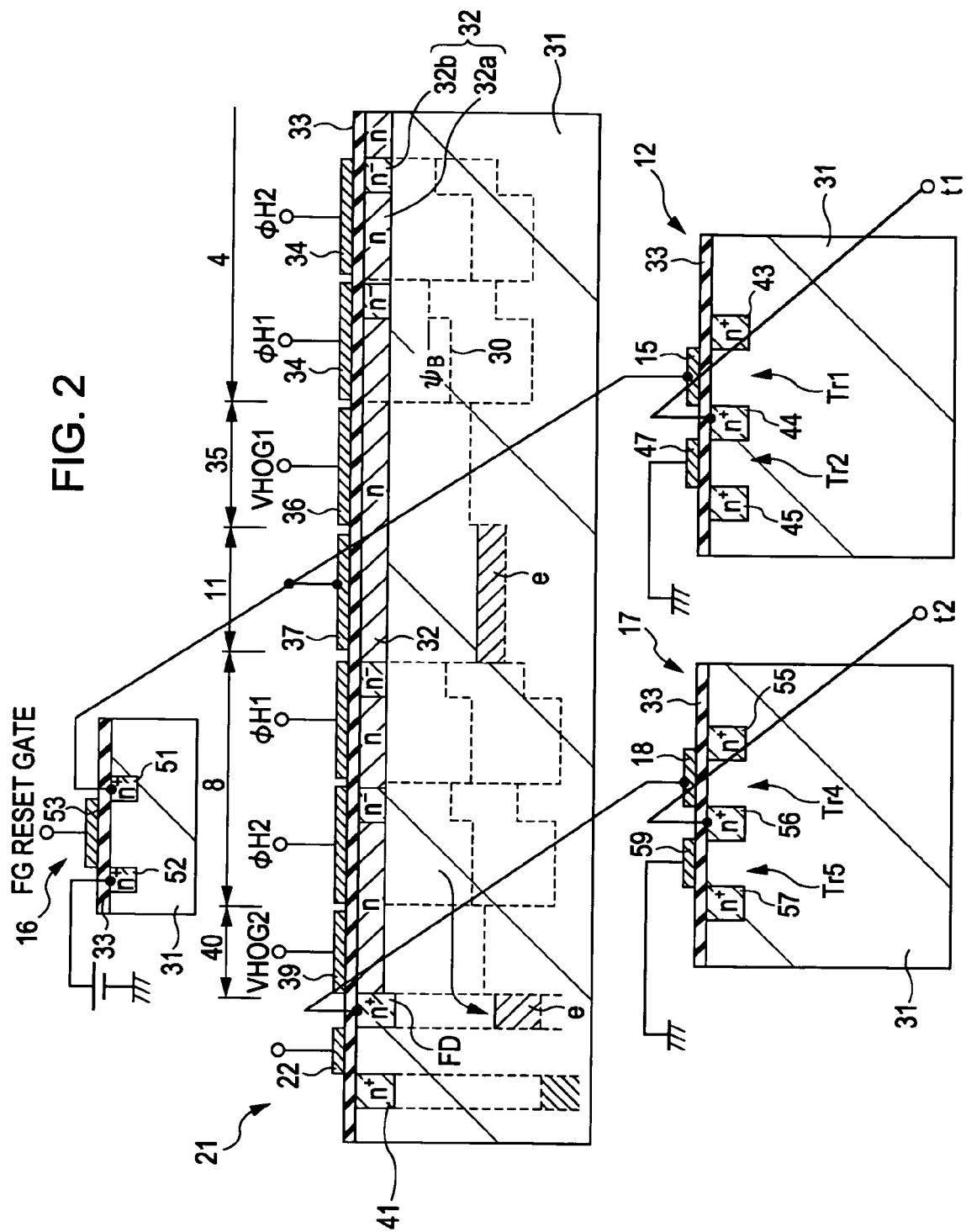
FIG. 2 is a cross-sectional view of a semiconductor cross-sectional structure of a main portion of an output section of the solid-state image pickup device according to the first embodiment.
Figure 3:
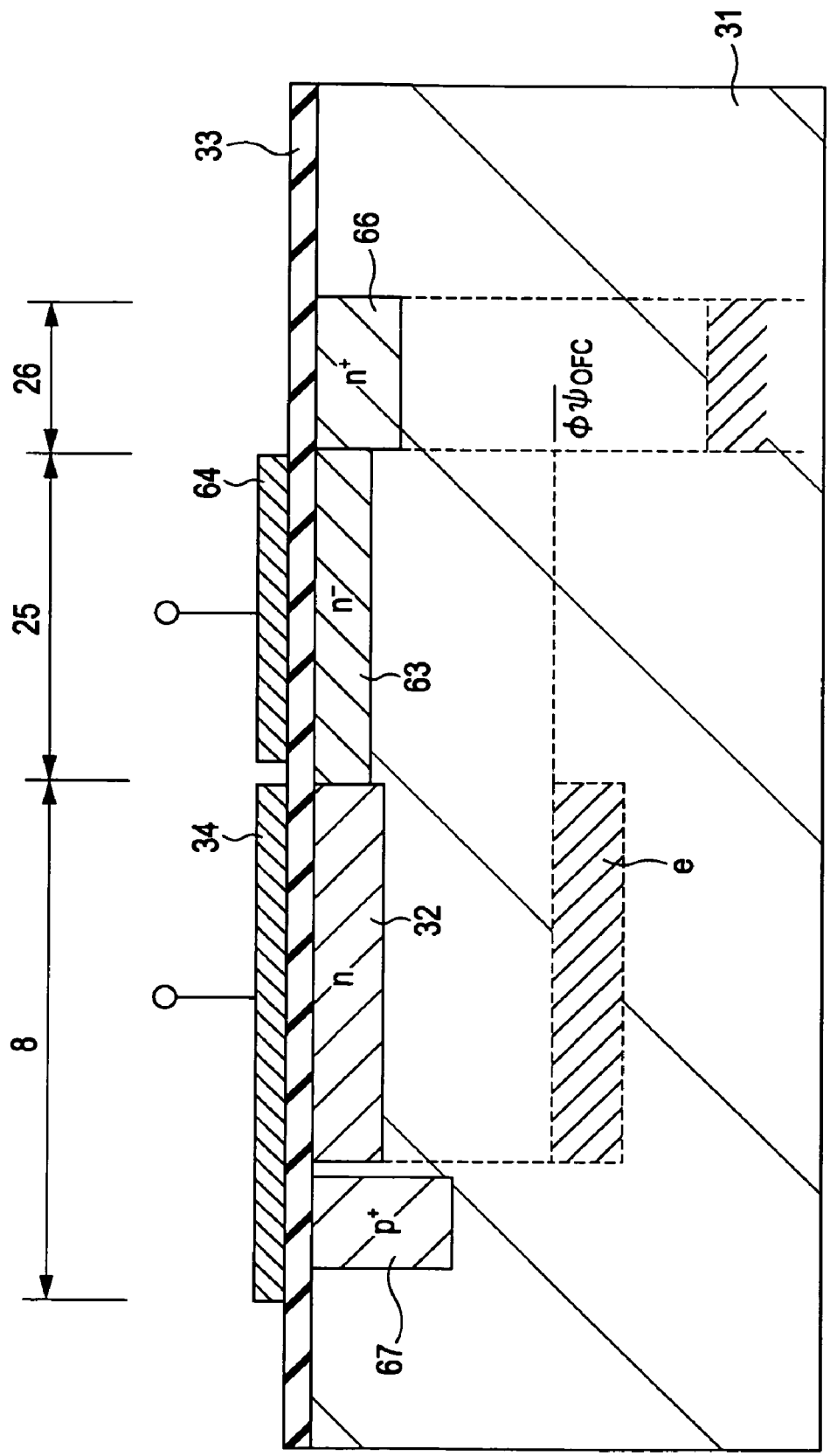
FIG. 3 is a cross-sectional view of a semiconductor cross-sectional structure of another main portion of the output section of the solid-state image pickup device according to the first embodiment.

In FIGS. 2 and 3, a semiconductor cross-sectional structure of a region from the horizontal transfer register 4 to the floating gate amplifier 7, the floating diffusion amplifier 9, the overflow drain mechanism 10, and so forth, which are placed at subsequent stages. As shown in FIG. 2, the horizontal transfer register 4 has a configuration in which a first-conductivity-type, e.g., n-type, embedded transfer channel 32 is formed on a front side of a semiconductor substrate 31, and in which a plurality of horizontal transfer electrodes 34 are arranged above the transfer channel 32 in a charge transfer direction so that a gate insulator film 33 is provided between the horizontal transfer electrodes 34 and the transfer channel 32. The semiconductor substrate 31 is a second-conductivity-type, e.g., p-type, region. In our all embodiments, a second-conductivity-type well, e.g., p-well, region can be used for the region corresponding to the semiconductor substrate 31. The horizontal transfer electrodes 34 are divided into two groups by being alternately selected. The horizontal transfer electrodes 34 of one of the groups are commonly connected to one another, and the drive pulse φH1 having a first phase is applied to the horizontal transfer electrodes 34. The horizontal transfer electrodes 34 of the other group are commonly connected to one another, and the drive pulse φH2 having a second phase is applied to the horizontal transfer electrodes 34. Each of transfer units, which has a corresponding of the horizontal transfer electrodes 34, includes a storage part and a transfer part so that the transfer unit has potential steps in the charge transfer direction. The storage part is formed using an n region 32a of the transfer channel 32, and the transfer part is formed using an n⁻ region 32b that is one low-density portion of the transfer channel 32.

The floating gate unit 11 is formed at the output side of the horizontal transfer register 4 so that a first horizontal output gate section 35 is provided between the floating gate unit 11 and the horizontal transfer register 4. The first horizontal output gate section 35 has a configuration in which a gate electrode 36 is formed above the transfer channel 32 so that the gate insulator film 33 is provided between the gate electrode 36 and the transfer channel 32, and a fixed voltage VHOG1 is applied to the gate electrode 36. The floating gate unit 11 has a configuration in which a floating gate electrode 37 is formed above the transfer channel 32 so that the gate insulator film 33 is provided between the floating gate electrode 37 and the transfer channel 32.

Furthermore, the horizontal transfer register 8 is formed at a stage subsequent to the floating gate unit 11. The floating diffusion unit FD is formed at the final stage of the horizontal transfer register 8 so that a second horizontal output gate section 40 is provided between the floating diffusion unit FD and the horizontal transfer register 8. The reset transistor 21 is connected to the floating diffusion unit FD.

As in the case of the horizontal transfer register 4, the horizontal transfer register 8 has a configuration in which the horizontal transfer electrodes 34 are formed above the continuously formed transfer channel 32 so that the gate insulator film 33 is provided between the horizontal transfer electrodes 34 and the transfer channel 32. The drive pulses φH1 and φH2 having two phases are also applied to the horizontal transfer electrodes 34. The second horizontal output gate section 40 has a configuration in which a gate electrode 39 is formed above the transfer channel 32 so that the gate insulator film 33 is provided between the gate electrode 39 and the transfer channel 32, and a fixed voltage VHOG2 is applied to the gate electrode 39. The floating diffusion unit FD is formed using an n-type semiconductor region.

The reset transistor 21 has the floating diffusion unit FD as a source region, and includes the source region, a drain region 41, and the reset gate electrode 22 that is formed on the gate insulator film 33. For example, a power source voltage is applied to the drain region 41, and a reset pulse is applied to the reset gate electrode 22, thereby turning on the reset transistor 21, so that the potential of the floating diffusion unit FD is reset to be the power source voltage.

On the other hand, on the semiconductor substrate 31, the source follower amplifier 12 that is connected to the floating gate unit 11 is formed, and, in addition, the reset transistor 16 that is connected to the floating gate unit 11 is formed. The source follower amplifier 12 includes the drive transistor Tr1 and a load transistor Tr2 that are configured, for example, using n-channel MOS transistors. In other words, n-type semiconductor regions 43, 44, and 45 are formed on the semiconductor substrate 31. The drive transistor Tr1 has the semiconductor regions 43 and 44 as a drain region and a source region, respectively, and has a configuration in which the gate electrode 15 is formed on the gate insulator film 33. Furthermore, the load transistor Tr2 has the semiconductor regions 44 and 45 as a drain region and a source region, respectively, and has a configuration in which a gate electrode 47 is formed on the gate insulator film 33. An output terminal t1 is led out from the semiconductor region 44 that is the source region of the drive transistor Tr1. The source follower amplifier 12 can have one stage or a plurality of stages. The floating gate electrode 37 of the floating gate unit 11 is connected to the gate electrode 15 of the drive transistor Tr1 that is placed at a first stage of the source follower amplifier 12. The floating gate amplifier 7 is configured using the floating gate unit 11 and the source follower amplifier 12.

Furthermore, the reset transistor 16 includes an n-type source region 51, a drain region 52, and a gate region 53 that is formed on the gate insulator film 33. The floating gate electrode 37 of the floating gate unit 11 is connected to the source region 51 of the reset transistor 16. Regarding the reset transistor 16, a reset pulse is applied to the gate region 53 thereof, and the power supply voltage is applied to the drain region 52.

On the semiconductor substrate 31, the source follower amplifier 17 that is connected to the floating diffusion unit FD is formed. The source follower amplifier 17 includes the drive transistor Tr4 and a load transistor Tr5 that are formed, for example, using n-channel MOS transistors. In other words, n-type semiconductor regions 55, 56, and 57 are formed on the semiconductor substrate 31. The drive transistor Tr4 has the semiconductor regions 55 and 56 as a drain region and a source region, respectively, and has a configuration in which the gate electrode 18 is formed on the gate insulator film 33. Furthermore, the load transistor Tr5 has the semiconductor regions 56 and 57 as a drain region and a source region, respectively, and has a configuration in which a gate electrode 59 is formed on the gate insulator film 33. An output terminal t2 is led out from the semiconductor region 56 that is the source region of the drive transistor Tr4. The source follower amplifier 17 can have one stage or a plurality of stages. The floating diffusion unit FD is connected to the gate electrode 18 of the drive transistor Tr4 that is placed at a first stage of the source follower amplifier 17. The floating diffusion amplifier 9 is configured using the floating diffusion unit FD and the source follower amplifier 17.

Furthermore, as shown in FIG. 3, the overflow drain mechanism 10 of a horizontal type that drains excess charge is formed at a position corresponding to the side portion of the horizontal transfer register 8 so as to be connected to the transfer units having the corresponding horizontal transfer electrodes 34 of the horizontal transfer register 8. The overflow drain mechanism 10 includes the overflow control gate region 25 so that the overflow control gate region 25 is in contact with a side portion of the n-type transfer channel 32 of the horizontal transfer register 8, more particularly, side portions of the storage parts which are formed using n regions, and includes the overflow drain region 26 that is formed using an n⁺ semiconductor region 66.

In other words, the overflow control gate region 25 has an n⁻ semiconductor region 63, for example, whose density is lower than that of the storage parts, on the semiconductor substrate 31, and has a configuration in which an overflow control gate electrode 64 is formed above the n⁻ semiconductor region 63 so that the gate insulator film 33 is provided between the overflow control gate electrode 64 and the n⁻ semiconductor region 63. A desired voltage is applied to the overflow control gate electrode 64, thereby setting a potential barrier level $\psi_{OFC}$ of the n⁻ semiconductor region 63 to be a level at which the above-mentioned excess charge can be drained. A desired positive voltage is applied to the n+ semiconductor region 66 of the overflow drain region 62. Note that, in FIG. 3, reference numeral 67 denotes a channel stop region, which is formed, for example, using a p-type semiconductor region, of the horizontal transfer register 8.

Figure 4:
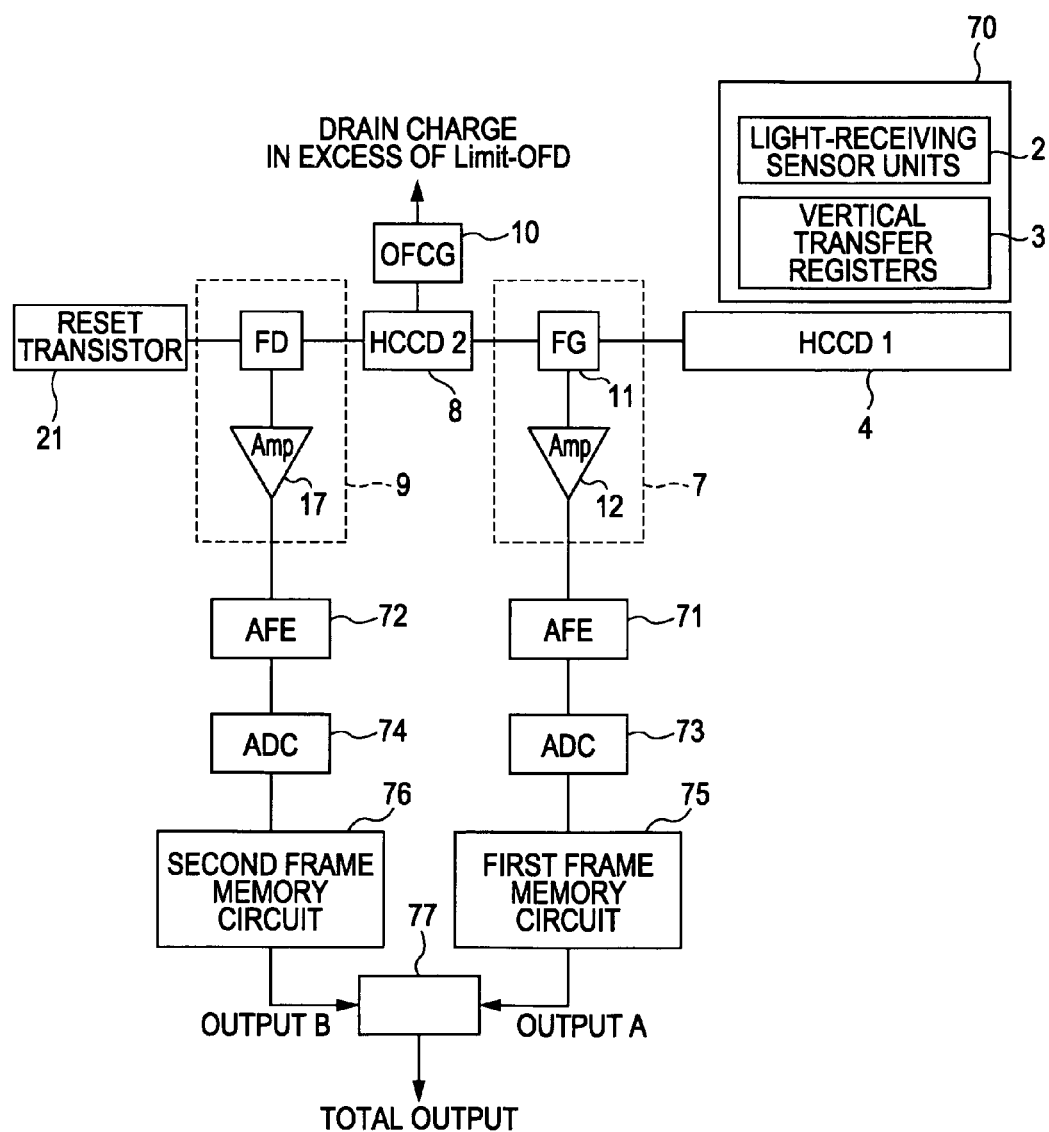
FIG. 4 is a schematic diagram of a configuration of a circuit block of the solid-state image pickup device according to the first embodiment.

FIG. 4 shows a configuration of a circuit block of the output section 5 related to reading of signals in the solid-state image pickup device according to the first embodiment. In FIG. 4, elements the same as those in FIG. 1 are denoted by the same reference numerals. The circuit block includes the image pickup region 70, which has the light sensing units 2 and the vertical transfer registers 3, and the horizontal transfer register 4. The floating gate unit 11, the horizontal transfer register 8, the floating diffusion unit FD, and the reset transistor 21 are connected to the output side of the horizontal transfer register 4 in this order. The overflow drain mechanism 10 is connected to the horizontal transfer register 8.

The floating gate amplifier 7 has a configuration in which the source follower amplifier 12 is connected to the floating gate unit 11. The floating diffusion amplifier 9 has a configuration in which the source follower amplifier 17 is connected to the floating diffusion unit FD. A first analog front end (AFE) 71 and a first analog-to-digital converter (ADC) 73 for converting analog image data of one line that is supplied from the horizontal transfer register 4 to digital data are connected to an output side of the floating gate amplifier 7. A first frame memory circuit 75 is connected to an output side of the first analog-to-digital converter (ADC) 73.

On the other hand, a second analog front end (AFE) 72 and a second analog-to-digital converter (ADC) 74 for converting analog image data of one line that is supplied from the horizontal transfer register 4 to digital data are connected to an output side of the floating diffusion amplifier 9. A second frame memory circuit 76 is connected to an output side of the second analog-to-digital converter (ADC) 74.

Furthermore, a verification circuit 77 is provided, which verification is performed on an output A of the first frame memory circuit 75 and an output B of the second frame memory circuit 76, and which outputs either the output A or the output B as a total output in accordance with a large amount of signal charge or a small amount of signal charge.

Figure 5:
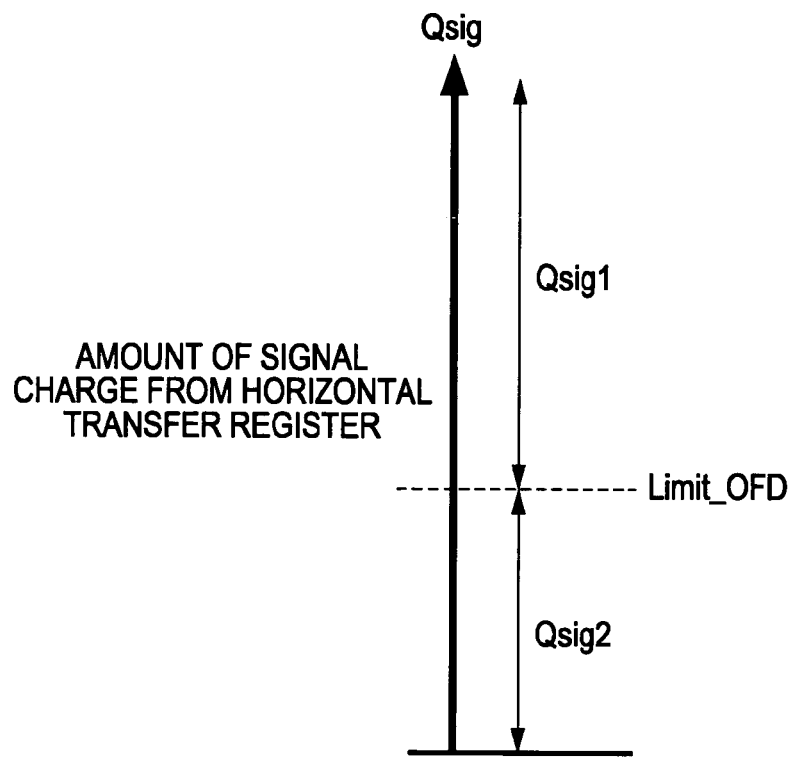
FIG. 5 is an illustration for explaining verification, determination, and outputting that are performed on an output signal from a floating gate amplifier and an output signal from a floating diffusion amplifier in the first embodiment.

In the verification circuit 77, verification is performed on the output A of the floating gate amplifier 7 and the output B of the floating diffusion amplifier 9. Here, as shown in FIG. 5, from the amount of signal charge that is supplied from the image pickup region 70, the amount of signal charge remaining after excess charge is drained with the overflow drain mechanism 10 is called a Limit-OFD. In the verification circuit 77, when the level of a signal that is the output A is equal to or higher than a level corresponding to the Limit-OFD, more preferably, when the level of a signal that is the output A exceeds the level corresponding to the Limit-OFD, the output A is used as the total output.

Furthermore, the level of a signal that is the output A is equal to or lower than the level corresponding to the Limit-OFD, more preferably, when the level of a signal that is the output A does not exceed the level corresponding to the Limit-OFD, the output B is used as the total output. However, a system is provided, in which a signal that is obtained by adding the output A to the output B can be used, and in which, alternatively, a signal that is the output A can be used.

When the amount of signal charge is equal to the Limit-OFD, either the output A of the floating gate amplifier 7 or the output B of the floating diffusion amplifier 9 can be used as the total output in accordance with an operation principal. It is only necessary that the dynamic range of the floating diffusion amplifier 9 be appropriate so that a level corresponding to the amount of signal charge which is "equal to" the Limit-OFD will be guaranteed.

In other words, regarding an amount of signal charge Qsig that is transferred from the horizontal transfer register 4 shown in FIG. 5, the output A is used for an amount of signal charge Qsig1 that exceeds the Limit-OFD, and the output B is used for an amount of signal charge Qsig2 that does not exceed the Limit-OFD.

In the circuit block, when an original signal is provided within a limit of the dynamic range of the floating diffusion amplifier 9 and is a small signal having a level that is lower than the level corresponding to the Limit-OFD, the output B of the floating diffusion amplifier 9 is employed as the total output. When an original signal is provided within the limit of the dynamic range of the floating diffusion amplifier 9 and is a large signal having a level that is higher than the level corresponding to the Limit-OFD, the output A of the floating gate amplifier 7 is employed as the total output.

Operations and Driving Method

Next, operations and a method for driving the solid-state image pickup device 1 according to the first embodiment will be described. In the light sensing units 2, photoelectric conversion is performed, and signal charge that is generated in accordance with the amount of received light is stored. The signal charge that is obtained by receiving light and that is stored in the light sensing units 2 is read to the vertical transfer registers 3 through reading gate units (not illustrated). The read signal charge is sequentially transferred inside the vertical transfer registers 3 using the vertical drive pulses φV1 to φV4 having four phases, thereby transferring the signal charge for each line to the horizontal transfer register 4. The signal charge that has been transferred to the horizontal transfer register 4 is sequentially transferred inside the horizontal transfer register 4 using the horizontal drive pulses φH1 and φH2 having two phases, and is sent to the output section 5. In the horizontal transfer register 4, as shown in FIG. 2, in each of the transfer units, a potential 30 has steps under a corresponding one of the horizontal transfer electrodes 34. The transfer part has a potential barrier $\psi_B$ to the storage part. Accordingly, signal charge e is transferred in a forward direction without being transferred in a reverse direction.

A case in which a large amount of signal charge is transferred will be described. When a large amount of signal charge is sent to the output section 5, first, the signal charge is transferred from the first horizontal output gate unit 35 to the floating gate unit 11. The potential of the floating gate electrode 37 of the floating gate unit 11 is changed from a potential in a reset state by the signal charge. The changed voltage is applied to the gate of the drive transistor Tr1 of the source follower amplifier 12 that is included in the floating gate amplifier 7 having a medium/low conversion gain. A large signal is output from the floating gate amplifier 7.

The large amount of signal charge passes through the floating gate unit 11, and is transferred to the horizontal transfer register 8 that is placed at the stage subsequent to the floating gate unit 11. Excess charge in excess of the above-described desired amount of charge is drained into the overflow drain region 26 via the overflow control gate region 25. The remaining signal charge e passes through the last transfer section 27 of the horizontal transfer register 8, and is transferred from the second horizontal output gate unit 40 to the floating diffusion unit FD. The potential of the floating diffusion unit FD is changed by the remaining signal charge. The potential of the floating diffusion unit FD is applied to the gate of the drive transistor Tr4 of the source follower amplifier 17 that is included in the floating diffusion amplifier 9 having a high conversion gain. A small signal corresponding to the remaining signal charge is output from the floating diffusion amplifier 9.

For each pixel, after a signal of the pixel is read, the potential of the floating gate electrode 37 is reset by the reset transistor 16, and, in addition, the potential of the floating diffusion unit FD is reset by the reset transistor 21.

Then, as shown in the block circuit illustrated in FIG. 4, the large signal from the floating gate amplifier 7 is stored in the first frame memory circuit 75 via the first analog front end (AFE) 71 and the first analog-to-digital converter (ADC) 73. Furthermore, the small signal corresponding to the remaining signal charge that is output from the floating diffusion amplifier 9 is stored in the second frame memory circuit 76 via the second analog front end (AFE) 72 and the second analog-to-digital converter (ADC) 74. The outputs of the first frame memory circuit 75 and the second frame memory circuit 76 are input to the verification circuit 77. Verification is performed on both of the outputs, and determination is performed.

Regarding the large signal that is the output of the first frame memory circuit 75, because the level of the large signal exceeds the level corresponding to the Limit-OFD, the large signal from the floating gate amplifier 7 is output from the verification circuit 77 as the total output.

Next, a case in which a small amount of signal charge is transferred will be described. When a small amount of signal charge is sent to the output section 5, first, the signal charge is transferred from the first horizontal output gate unit 35 to the floating gate unit 11. The voltage of the floating gate electrode 37 is changed by the small amount of signal charge. The changed voltage is applied to the gate of the drive transistor Tr1 of the source follower amplifier 12. A small signal is output from the floating gate amplifier 7 having a medium/low conversion gain.

The small amount of signal charge passes through the floating gate unit 11, and is transferred to the horizontal transfer register 8 that is placed at the stage subsequent to the floating gate unit 11. Because the small amount of signal charge does not exceed the above-described desired amount of charge, the small amount of signal charge is not drained with the overflow drain mechanism 10. Accordingly, the small amount of signal charge passes through the last transfer unit 27 of the horizontal transfer register 8 as it is, and is transferred from the second horizontal output gate unit 40 to the floating diffusion unit FD. The potential of the floating diffusion unit FD is changed by the small amount of signal charge. The potential of the floating diffusion unit FD is applied to the gate of the drive transistor Tr4 of the source follower amplifier 17 that is included in the floating diffusion amplifier 9 having a high conversion gain. Then, a small signal corresponding to the small amount of signal charge is output from the floating diffusion amplifier 9.

For each pixel, after a signal of the pixel is read, resetting of the potential of the floating gate electrode 37 and resetting of the potential of the floating diffusion unit FD are performed as in the case of the above-described case.

Then, as shown in the block circuit illustrated in FIG. 4, the small signal from the floating gate amplifier 7 is stored in the first frame memory circuit 75 via the first analog front end (AFE) 71 and the first analog-to-digital converter (ADC) 73. Furthermore, the small signal from the floating diffusion amplifier 9 is stored in the second frame memory circuit 76 via the second analog front end (AFE) 72 and the second analog-to-digital converter (ADC) 74. The outputs of the first frame memory circuit 75 and the second frame memory circuit 76 are input to the verification circuit 77. Verification is performed on both of the outputs, and determination is performed.

Regarding the small signal that is the output of the second frame memory circuit 76, because the level of the small signal does not exceed the level corresponding to the Limit-OFD, the small signal from the floating diffusion amplifier 9 is output from the verification circuit 77 as the total output.

With the solid-state image pickup device 1 according to the first embodiment and the method for driving the solid-state image pickup device 1, the output section 5 is provided at the output side of the horizontal transfer register 4, and has a configuration in which the floating gate amplifier 7 having a medium/low conversion gain and the floating diffusion amplifier 9 having a high conversion gain are placed. The floating diffusion amplifier 9 having a high conversion gain is used specifically for a small signal, whereby a high S/N ratio can be ensured in a case of the small signal and image pickup characteristics can be improved in a case of low illuminance. Furthermore, the floating gate amplifier 7 has advantages that it performs non-destructive reading and does not generate kTC noise. Since a large signal is read by the floating gate amplifier 7 that is placed at a stage previous to the floating diffusion amplifier 9, a high S/N ratio and a high dynamic range can be maintained even in a case of the large signal.

As described above, since the two amplifiers, i.e., the floating gate amplifier 7 and the floating diffusion amplifier 9, are provided, the solid-state image pickup device having the output section that supports input signals corresponding to a wide range of light amount can be structured.

More particularly, in a solid-state image pickup device in which the size of pixels is comparatively large and in which the amount of signal charge that light sensing units or transfer registers can handle is large, an output section that can realize a high sensitivity, a high S/N ratio, and a high dynamic range can be configured. In other words, in a CCD solid-state image pickup device that includes comparatively large pixels and that can handle a large amount of signal charge, such as a large solid-state image pickup device, high S/N ratio characteristics can be ensured in a case of low illuminance, and the dynamic range can be maintained in a case of a large signal.

Since a large signal is read by the floating gate amplifier 7 having a medium/low conversion gain, even when a large amount of signal charge is supplied, a voltage to be obtained is represented by the amount of signal charge×the conversion gain, and the large amount of signal charge does not negatively affect a signal processing system.

Since, in the vicinity of the floating diffusion unit FD of the horizontal transfer register 8, the last transfer unit 27 whose transfer channel width d1 becomes gradually small is provided, the dimensions of the floating diffusion unit FD can be reduced. Accordingly, the amount of signal charge that can be handled can be reduced for a small signal, and the floating diffusion amplifier 9 having a high conversion gain can be configured.

The overflow drain mechanism 10 is provided at the stage subsequent to the floating gate amplifier 7. One portion of a large amount of signal charge is drained, thereby obtaining the amount of signal charge that the floating diffusion unit FD can handle, and the amount of charge that the floating diffusion unit FD can handle is transferred to the floating diffusion unit FD. In other words, the overflow drain mechanism 10 drains, from signal charge that has passed through the floating gate amplifier 7, excess charge in excess of the amount of charge that the floating diffusion amplifier 9 or the last transfer unit 27 can handle. That is, the overflow drain mechanism 10 drains excess charge beyond the dynamic range of the floating diffusion amplifier 9. Accordingly, the amount of charge that the floating diffusion unit FD can handle is a reduced amount, and a large amount of signal charge is not transferred to the floating diffusion unit FD. Thus, no problem occurs in the floating diffusion amplifier 9.

Second Embodiment

Example of Configuration of Solid-State Image Pickup Device

In the above example, a configuration is provided, in which one floating gate amplifier 7 is placed. However, a configuration may be used, in which a plurality of floating gate amplifiers 7 are placed along the charge transfer direction. In other words, although the configuration is not illustrated, referring to FIG. 1, a plurality of floating gate amplifiers 7 are placed in the charge transfer direction at the output side of the horizontal transfer register 4. The configuration for the other elements is the same as that described with reference to FIG. 2. In a solid-state image pickup device according to a second embodiment, signals are sequentially read from the respective floating gate amplifiers 7 at time intervals. However, the signals are processed using a processing circuit that is placed at a subsequent stage, e.g., delay lines, so that the signals will be referred from the same time axis.

With the solid-state image pickup device according to the second embodiment, reading of a signal is performed a plurality of times (n times) by the plurality of the floating gate amplifiers 7. Accordingly, the solid-state image pickup device according to the second embodiment has an advantage that noise is reduced by only $1/\sqrt{n}$. Further, advantages similar to those described in the first embodiment can be achieved.

An interline (IT) CCD solid-state image pickup device, a frame transfer (FT) CCD solid-state image pickup device, or a frame interline transfer (FIT) CCD solid-state image pickup device can be applied as the above-described solid-state image pickup device according to the second embodiment of the present invention.

Third Embodiment

Example of Configuration of Electronic Apparatus

Any one of the above-described solid-state image pickup devices according to the embodiments of the present invention can be applied in an electronic apparatus that is, for example, a camera system such as a digital camera or a video camera, a mobile phone having an image pickup function, or a different apparatus having an image pickup function.

Figure 6:
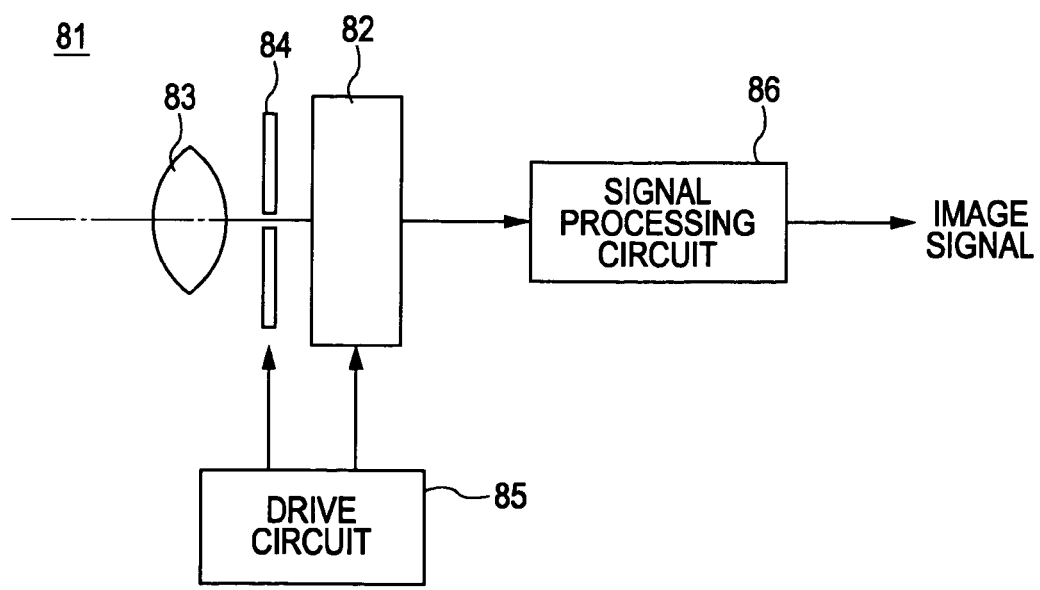
FIG. 6 is a schematic diagram of a configuration of an electronic apparatus according to a third embodiment of the present invention.

FIG. 6 shows a camera according to a third embodiment as one example of the electronic apparatus according to the third embodiment of the present invention. The camera according to the third embodiment is one example of a video camera that can pick up a still image or a moving image. A camera 81 according to the third embodiment includes a solid-state image pickup device 82, an optical system 83, which leads incident light to light sensing units of the solid-state image pickup device 82, a shatter device 84, a drive circuit 85, which drives the solid-state image pickup device 82, and a signal processing circuit 86, which processes output signals from the solid-state image pickup device 82.

Any one of the above-described solid-state image pickup devices according to the respective embodiments is applied as the solid-state image pickup device 82. The optical system (an optical lens) 83 forms an image on an image pickup face of the solid-state image pickup device 82 using light corresponding to the image (incident light) from an object. Accordingly, signal charge is stored in the solid-state image pickup device 82 in a fixed period. The optical system 83 may be an optical lens system that is configured using a plurality of optical lenses. The shatter device 84 controls a period in which light is emitted to the solid-state image pickup device 82 and a period in which light is blocked. The drive circuit 85 supplies drive signals with which a transfer operation of the solid-state image pickup device 82 and a shatter operation of the shatter device 84 are controlled. With a corresponding one of the drive signals (timing signals) that are supplied from the drive circuit 85, the solid-state image pickup device 82 performs signal transfer. The signal processing circuit 86 performs various types of signal processing. Image signals that have been subjected to signal processing are stored in a storage medium such as a memory, or are output on a monitor.

With the electronic apparatus according to the third embodiment, even when the size of pixels is large and the amount of charge that can be handled is large in the solid-state image pickup device, a high dynamic range and a high S/N ratio can be maintained. Thus, the high-quality electronic apparatus can be provided. For example, a single-lens reflex camera in which the size of pixels is large can be provided.

The present application contains subject matter related to that disclosed in Japanese Priority Patent Application JP 2008-251667 filed in the Japan Patent Office on Sep. 29, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
    a plurality of light sensing sections;
    a plurality of vertical transfer registers configured to transfer signal charge of the plurality of light sensing sections in the vertical direction;
    a horizontal transfer register configured to transfer the signal charge in the horizontal direction;
    a floating gate amplifier that is placed at an output side of the horizontal transfer register;
    a floating diffusion amplifier that is placed in a horizontal transfer register which is provided at a stage subsequent to the floating gate amplifier; and
    an overflow drain mechanism that is placed in the horizontal transfer register between the floating gate amplifier and the floating diffusion amplifier,
    wherein the floating gate amplifier has a conversion gain lower than that of the floating diffusion amplifier,
    wherein, in the solid-state image pickup device, verification is performed on an output signal from the floating gate amplifier and an output signal from the floating diffusion amplifier,
    wherein, in a case in which an original signal is provided within a limit of a dynamic range of the floating diffusion amplifier and is a small signal having a level that is lower than a level corresponding to an amount of signal charge remaining after draining is performed with the overflow drain mechanism, the output signal from the floating diffusion amplifier is employed, and
    wherein, in a case in which the original signal is a large signal having a level that is higher than the level corresponding to the amount of signal charge remaining, the output signal from the floating gate amplifier is employed.

2. The solid-state image pickup device according to claim 1, wherein the horizontal transfer register that is placed in the vicinity of a floating diffusion unit which is included in the floating diffusion amplifier has a last transfer unit, a transfer channel width of the last transfer unit becoming smaller in a direction toward the floating diffusion unit.

3. The solid-state image pickup device according to claim 2, wherein the overflow drain mechanism drains, from signal charge that has passed through the floating gate amplifier, excess charge in excess of an amount of charge that the floating diffusion amplifier or the last transfer unit is able to handle.

4. The solid-state image pickup device according to claim 3, wherein a large amount of signal charge is read by the floating gate amplifier, and a small amount of signal charge is read by the floating diffusion amplifier.

5. The solid-state image pickup device according to claim 1, wherein the overflow drain mechanism drains excess charge beyond a dynamic range of the floating diffusion amplifier.

6. The solid-state image pickup device according to claim 5, wherein a large amount of signal charge is read by the floating gate amplifier, and a small amount of signal charge is read by the floating diffusion amplifier.

7. The solid-state image pickup device according to claim 5, wherein the overflow drain mechanism includes an overflow control gate region and an overflow drain region.

8. The solid-state image pickup device according to claim 7, wherein the overflow control gate region is configured to cause to be drained excess charge in excess of an amount of charge that the floating diffusion amplifier or a last transfer unit is able to handle.

9. The solid-state image pickup device according to claim 7, wherein the overflow gate region is formed at a side portion of the horizontal transfer register.

10. A method for driving a solid-state image pickup device, the method comprising:
reading, with a floating gate amplifier, a large amount of signal charge that has been transferred inside a horizontal transfer register; and
reading, with a floating diffusion amplifier, a small amount of signal charge that has been transferred inside the horizontal transfer register, the floating diffusion amplifier being placed at a stage subsequent to the floating gate amplifier and having a conversion gain higher than that of the floating gate amplifier,
wherein, from the large amount of signal charge that has passed through the floating gate amplifier, excess charge beyond a dynamic range of the floating diffusion amplifier is drained into an overflow drain mechanism,
wherein verification is performed on an output signal from the floating gate amplifier and an output signal from the floating diffusion amplifier,
wherein, in a case in which an original signal is provided within a limit of a dynamic range of the floating diffusion amplifier and is a small signal having a level that is lower than a level corresponding to an amount of signal charge remaining after draining is performed with the overflow drain mechanism, the output signal from the floating diffusion amplifier is employed, and
wherein, in a case in which the original signal is a large signal having a level that is higher than the level corresponding to the amount of signal charge remaining, the output signal from the floating gate amplifier is employed.

11. The method for driving a solid-state image pickup device according to claim 10, wherein, from the large amount of signal charge that has passed through the floating gate amplifier, excess charge in excess of an amount of charge that the floating diffusion amplifier or a last transfer unit is able to handle is drained into an overflow drain mechanism, a transfer channel width of the last transfer unit becoming smaller in a direction toward a floating diffusion unit.

12. An electronic apparatus comprising:
an optical system;
a solid-state image pickup device; and
a signal processing circuit configured to process an output signal of the solid-state image pickup device,
the solid-state image pickup device including
a plurality of light sensing sections,
a plurality of vertical transfer registers configured to transfer signal charge of the plurality of light sensing sections in the vertical direction,
a horizontal transfer register configured to transfer the signal charge in the horizontal direction,
a floating gate amplifier that is placed at an output side of the horizontal transfer register,
a floating diffusion amplifier that is placed in a horizontal transfer register which is provided at a stage subsequent to the floating gate amplifier, and
an overflow drain mechanism that is placed in the horizontal transfer register between the floating gate amplifier and the floating diffusion amplifier,
wherein, in the solid-state image pickup device, the floating gate amplifier has a conversion gain lower than that of the floating diffusion amplifier,
wherein in the solid-state image pickup device, verification is performed on an output signal from the floating gate amplifier and an output signal from the floating diffusion amplifier,
wherein, in a case in which an original signal is provided within a limit of a dynamic range of the floating diffusion amplifier and is a small signal having a level that is lower than a level corresponding to an amount of signal charge remaining after draining is performed with the overflow drain mechanism, the output signal from the floating diffusion amplifier is employed, and
wherein, in a case in which the original signal is a large signal having a level that is higher than the level corresponding to the amount of signal charge remaining, the output signal from the floating gate amplifier is employed.

13. The solid-state image pickup device according to claim 12, wherein the overflow drain mechanism an overflow control gate region and an overflow drain region.

14. The solid-state image pickup device according to claim 13, wherein the overflow control gate region is configured to cause to be drained excess charge in excess of an amount of charge that the floating diffusion amplifier or a last transfer unit is able to handle.

15. The solid-state image pickup device according to claim 13, wherein the overflow gate region is formed at a side portion of the horizontal transfer register.

* * * * *